United States Patent [19]

Bloks

[11] Patent Number: 5,063,273
[45] Date of Patent: Nov. 5, 1991

[54] PROTECTIVE HOUSING FOR APPARATUS

[75] Inventor: Hubertus M. H. A. Bloks, Elim, Netherlands

[73] Assignee: Fokker Special Products B.V., AN Hoogeveen, Netherlands

[21] Appl. No.: 472,322

[22] Filed: Jan. 30, 1990

[30] Foreign Application Priority Data

Feb. 1, 1989 [NL] Netherlands .......................... 8900248

[51] Int. Cl.$^5$ ............................................... H05K 9/00
[52] U.S. Cl. ........................... 174/35 R; 219/10.55 D; 174/35 MS
[58] Field of Search .............. 174/6, 7, 51, 78, 35 MS, 174/35 R; 361/424; 219/10.55 D, 10.55 R

[56] References Cited

U.S. PATENT DOCUMENTS

| 2,333,532 | 11/1943 | Frakes et al. | 175/183 |
| 2,449,313 | 9/1948 | Naef | 174/6 |
| 3,334,597 | 9/1967 | Ruskin | |
| 3,982,058 | 9/1976 | Hill | 174/2 |
| 4,670,347 | 6/1987 | Lasik et al. | 428/458 |
| 4,902,997 | 2/1990 | Moran | 336/84 C |

FOREIGN PATENT DOCUMENTS 377670 4/1985 Austria .
369880 9/1930 United Kingdom .

OTHER PUBLICATIONS

IBM Tech Bulletin, vol. 17, No. 12, pp. 3662-3663, May 1975.

Primary Examiner—Leo P. Picard
Assistant Examiner—Bot L. Ledynh
Attorney, Agent, or Firm—Willin Brinks Olds Hofer Gilson & Lione

[57] ABSTRACT

The invention relates to a housing for electrical and/or electronic apparatus, which protects the apparatus against leakage to the outside of information-carrying, electrical and/or magnetic fields and electromagnetic radiation generated by the apparatus, the housing also protects against crosstalk between information-carrying conductors and/or conducting parts, and against undesired influencing of the apparatus by electrical and/or magnetic fields and electromagnetic radiation of external origin.

The housing is constructed of an inner housing portion acting as a Faraday cage, an outer housing portion acting as Faraday cage wholly encasing the inner housing portion, where the housing portions are insulated from one another electrically, a first earth conductor electrically connected to the inner housing portion, and a second earth conductor electrically connected to the outer housing portion, where the earth conductors are situated at a sufficient mutual distance and at a sufficient depth in the ground such that on the one hand effective earthing of both housing portions is ensured and on the other hand crosstalk between both housing portions is absent, and an earthing loop is avoided.

16 Claims, 2 Drawing Sheets

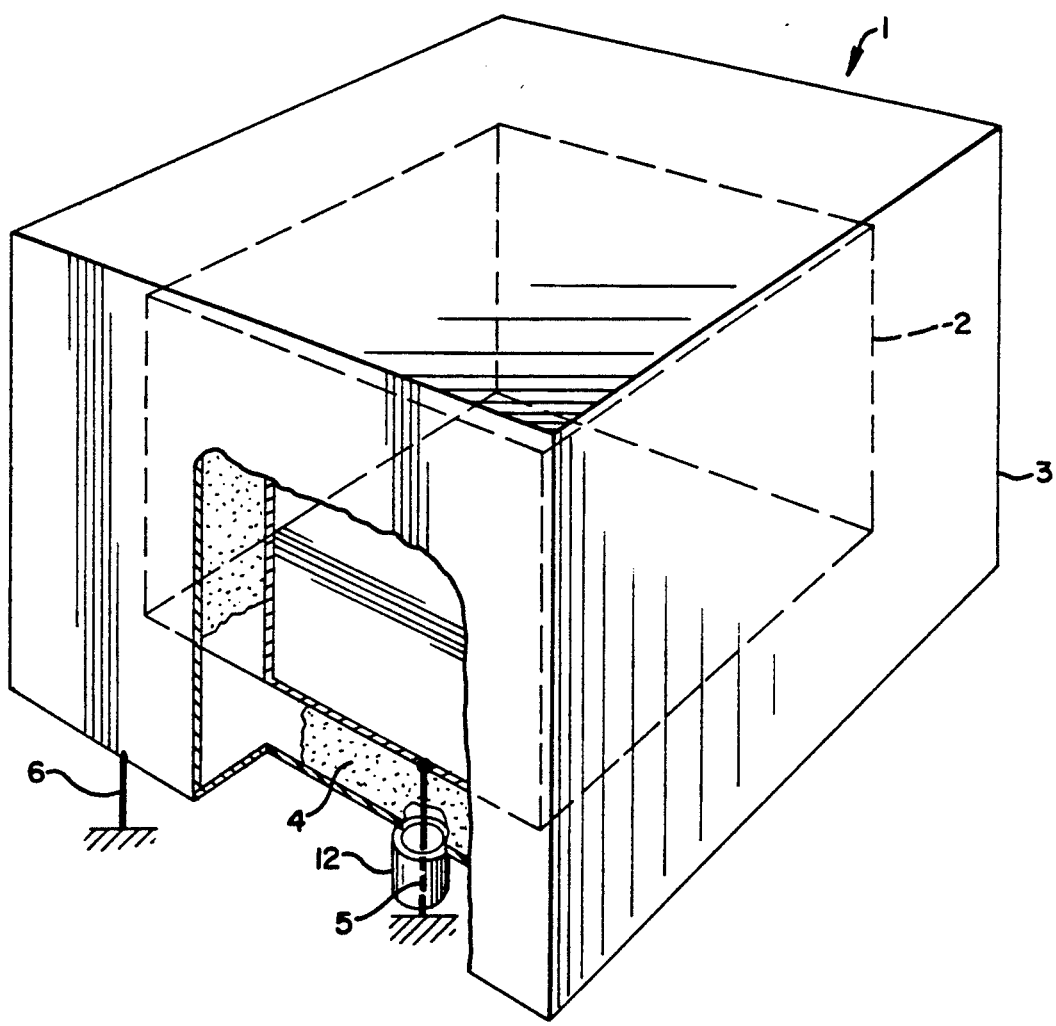
Fig_1

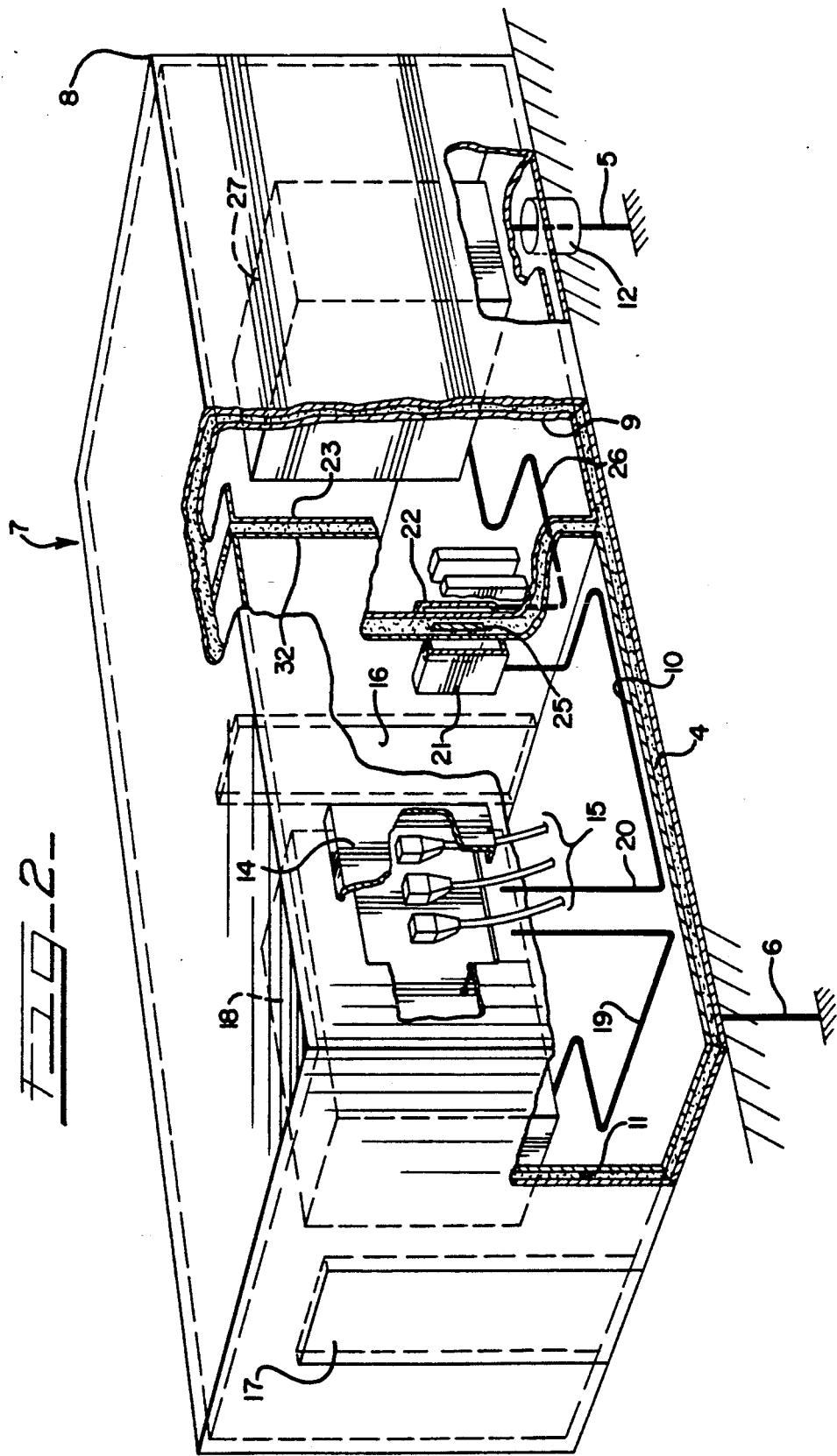

PROTECTIVE HOUSING FOR APPARATUS

BACKGROUND AND SUMMARY

The invention relates to a housing for electrical and-/or electronic apparatus, which housing comprises means for protecting the apparatus against leakage to outside of information carrying, electrical and/or magnetic fields and electromagnetic radiation generated during operation of the apparatus, as well as against crosstalk between information carrying conductors and/or conducting parts, and against undesired influencing of the apparatus by electrical and/or magnetic fields and electromagnetic radiation of external origin.

Such a housing is known. It serves to accommodate apparatus and operative personnel that may be present. Such a housing is known in various embodiments.

According to the invention the said housing is characterized by an inner housing portion acting as a Faraday cage, an outer housing portion acting as Faraday cage entirely encasing the inner housing portion, which housing portions are mutually insulated electrically, a first earth conductor electrically connected to the inner housing portion, and a second earth conductor electrically connected to the outer housing portion, which earth conductors are situated at a sufficient mutual distance and are placed at a sufficient depth in the ground such that on the one hand effective earthing of both housing portions is ensured and on the other hand crosstalk between both housing portions is absent and an earthing loop is avoided.

With this construction according to the invention the apparatus accommodated in the inner housing portion is doubly shielded. A further insight underlying the construction according to the invention is that it is of essential importance to avoid an earthing loop, that is, an essentially conducting connection via the ground between both earth conductors. The second earth conductor serves as safety earth with the purpose of carrying away charges which can be built up by EMP (electromagnetic pulses). The first earth conductor can serve to make negligibly small the influence of "TEMPEST". This is a form of electromagnetic influence of apparatus known in the literature.

The above mentioned phenomena, EMP and TEMPEST, relate to the influencing of the apparatus for protection by external sources. Such safety or shielding is of essential importance in guaranteeing proper operation of the apparatus under even the most extreme electromagnetic, electrical and magnetic conditions.

On the other hand, for example telecommunications apparatus, computer apparatus or the like also has to be protected such that leakage of information to outside, and thereby the possibility of listening in by third parties, is excluded.

Use of only one earth connection gives a galvanic coupling between the two systems to be separated as well as possible. For TEMPEST a separate earth therefore always has to be used which is practically entirely separated galvanically from the safety earth. Nor may there exist any noticeable inductive or capacitive coupling between both earth conductors. It is namely so that such a coupling could also result in crosstalk.

It will be apparent from the above that both earth connections have to be arranged in the ground at a certain minimal effective distance from one another.

The housing is preferably characterized by an electrically conducting sleeve protruding on the side of the outer housing portion and through which the first earth conductor extends.

In a particular embodiment the housing displays a second inner housing portion completely encased by the outer housing portion, which inner portion is connected via electrically conducting elements to the outer housing portion and is electrically insulated from the first inner housing portion.

It will be apparent that this second inner housing portion offers a less effective shielding with respect to TEMPEST than the first inner housing portion; it is in any case locally connected galvanically to the outer housing portion for instance by conducting strips, while the first inner housing portion is completely separated galvanically from that outer housing portion and is entirely separately earthed. The second outer housing portion can thus serve for instance to accommodate less sensitive apparatus or apparatus for which the same requirements with regard to confidentiality of the information do not apply. The second inner housing portion can also be accessible from outside by means of a double-walled door. This door has to be embodied such that in closed position it leaves unimpaired the electrical and/or magnetic properties of the housing.

The housing can further display the special feature that all electrical power cables and information carrying electrical cables enter the housing via the second inner housing portion.

In order to secure as well as possible the apparatus present in the first inner housing portion a housing preferably displays the feature that all electrical power cables and information carrying electrical cables between both housing portions are fed through adjoining walls of both housing portions and that at that position a filter is arranged in all the said cables and/or a shield is arranged around all the said cables.

Both inner housing portions can also be connected to one another via a door or hatch to which the same requirements otherwise apply as for the door briefly described above. After the above it will be apparent that this door has to be embodied such that it is double-walled with a complete galvanic separation between two conducting skin plates which at least in the closed position of the door are connected for electrical conduction to the respective walls of the inner housing portions.

A very simple and thereby cheap but nevertheless reliable construction is obtained with a housing which has the special feature that between the outer housing portion and the or each inner housing portion is situated an insulating layer consisting of foam substance such as polyurethane foam.

BRIEF DESCRIPTION OF THE DRAWING

The invention will now be elucidated with reference to the annexed drawing. In the drawing:

FIG. 1 shows a partly broken away perspective view of a schematically depicted housing according to the invention in a first embodiment; and FIG. 2 shows a partly broken away perspective view of a preferred embodiment of the housing according to the invention.

FIG. 1 shows a housing 1 for apparatus. This housing 1 comprises an inner housing portion 2 of metal acting as a Faraday cage, an outer housing portion 3 acting as a Faraday cage and completely encasing that inner housing portion 2, which housing portions 2 and 3 are electrically insulated from one another by means of a polyurethane foam layer 4. A first earth conductor 5 is connected to the inner housing portion 2. A second earth conductor 6 is connected to the outer housing portion 3. The earth conductors 5 and 6 are placed at a mutual distance and at a depth in the ground such that electrical, magnetic and/or electromagnetic crosstalk is practically absent. The earth conductors 5 and 6 are otherwise only designated symbolically for the purpose of schematic representation.

FIG. 2 shows a housing 7 with an outer housing portion 8, a first inner housing portion 9 and a second inner housing portion 10. The inner housing portion 9 has the same function as the inner housing portion 2 according to FIG. 1. The outer housing portion 8 corresponds with the outer housing portion 3 according to FIG. 1. In contrast to the housing 1 the housing 7 has the additional second inner housing portion 10 which is connected locally to the outer housing portion 8 by means of conducting strips 11.

The outer housing portion 8 is earthed via the earth conductor 6. The second inner housing portion 10 is also earthed via this earth conductor 6 via the conductors 11. The first inner housing portion 9 is earthed entirely separately via the earth conductor 5. The housing portions 8, 9 and 10 are separated from each other by the PUR foam layer 4.

Serving to encase the earth conductor 5 is a conducting sleeve 12 which is connected to, and protrudes on the underside of, the bottom surface of the outer housing portion 8. Hereby prevented is the possibility of free radiation in and/or radiation out via the earth conductor 5, for example in a portion thereof that may be above-ground.

Arranged on the outer side of the outer housing portion 8 is a schematically designated junction box 14. This serves for connection and through-feed of power cables and information carrying cables 15. These cables enter via the second inner housing portion 10.

Present in the second inner housing portion 10 is schematically shown electronic apparatus 18. This is connected by means of a cable 19 to the junction box 14. This cable can comprise supply conductors and information carrying conductors.

A second cable 20 leads through the second inner housing portion 10 to a junction box 21. This is arranged on the wall 32 of the second inner housing portion 10 which is located adjacent to the wall 23 of the first inner housing portion 9. Arranged on this wall 23 at a corresponding place is a third junction box 22. Between both boxes 21 and 22 are arranged power cables and information carrying cables. A filter box 25 likewise serving as shield is arranged in the PUR foam layer 4 and serves as through-feed for the relevant cables.

A cable 26 connects apparatus 27 present in the first inner housing portion 9 to the junction box 22.

Both inner housing portions 9 and 10 are connected to one another via a double-walled door 16. This door 16 comprises two electrically conducting plates which are separated from one another electrically and in the closed position of the door once again completely close off the relevant walls in an electrical and magnetic sense.

A similar door 17 serves for entry from the outside into the space enclosed by the second inner housing portion 10.

I claim:

1. A housing for shielding an apparatus from electrical and magnetic signals and fields, electromagnetic radiation, cross-talk between signal carrying conductors and conducting parts, and leakage into the surrounding environment from the apparatus of electrical and magnetic signals, comprising:
   a) an inner housing acting as a Faraday cage;
   b) an outer housing acting as a Faraday cage enveloping the inner housing at a spaced position therefrom and defining an interstitial substantially continuous cavity therebetween; and
   c) means for electrically insulating the inner housing from the outer housing;
   d) first grounding means connected to the inner housing;
   e) second grounding means connected to the outer housing; and
   f) the first and second grounding means being spaced apart to avoid any galvanic, inductive or capacitive coupling between the first and second grounding means.

2. The housing of claim 1 wherein the means for electrically insulating the inner housing from the outer housing comprises an insulating material in the interstitial substantially continuous cavity between the inner housing and the outer housing.

3. The housing of claim 2, wherein the insulating material comprises a polyurethane foam.

4. The housing of claim 1 wherein the outer housing has an electrically conducting sleeve protruding from a bottom surface of the outer housing and through which the first grounding means extends.

5. A housing for shield an apparatus from electrical and magnetic signals and fields, electromagnetic radiation, cross-talk between signal carrying conductors and conducting parts, and leakage into the surrounding environment from the apparatus of electrical and magnetic signals, comprising:
   a) a first inner housing acting as a Faraday cage;
   b) a second inner housing which occupies a separate volume and is spaced apart from the first inner housing;
   c) an outer housing acting as a Faraday cage enveloping the first and second inner housing at a spaced position therefrom and defining an interstitital substantially continuous cavity between the outer housing and the first and second inner housings;
   d) means for electrically insulating the first inner housing from the outer housing;
   e) means for electrically insulating the first inner housing from the second inner housing; and
   f) means for electrically connecting the second inner housing to the outer housing.

6. The housing of claim 5 further comprising:
   a) first grounding means connected to the first inner housing; and
   b) second grounding means connected to the outer housing;
   c) the first and second grounding means being spaced apart to avoid any galvanic, inductive or capacitive coupling between the first grounding means and second grounding means.

7. The housing of claim 6 wherein the outer housing has an electrically conducing sleeve protruding from a bottom surface of the outer housing and through which the first grounding means extends.

8. The housing of claim 5 wherein the means for electrically insulating the first inner housing from the outer housing comprises an insulating material in the interstitial substantially continuous cavity between the outer housing and the first and second inner housings.

9. The housing of claim 8 wherein the insulating material comprises a polyurethane foam.

10. The housing of claim 5 wherein the means for electrically insulating the first inner housing from the second inner housing comprises an insulating material in the space between the first inner housing and the second inner housing.

11. The housing of claim 10 wherein the insulating material comprises a polyurethane foam.

12. The housing according to claim 5 further comprising:
  a) a first junction box connected to the first inner housing;
  b) a second junction box connected to the second inner housing;
  c) a third junction box connected to the outer housing;
  d) junction box cables which connect the second junction box to the third junction box;
  e) electrical power and information carrying cables running from the exterior of the outer housing into the interior of the second housing; and
  f) electrical power and information carrying cables running from the interior at the second housing into the interior of the first housing;
  g) the electrical power and information carrying cables running from the exterior of the outer housing into the second housing being connected to the third junction box;
  h) the electrical power and information carrying cables running from the interior of second housing into the interior of first housing being connected to the second junction box.

13. The housing of claim 12 further comprising a filter placed in the path of the junction box cables and through which the junction box cables feed.

14. The housing of claim 12 further comprising a shield surrounding the electrical power and information carrying cables within the first inner housing and the second inner housings to provide protection from electrical and magnetic disturbances.

15. The housing of claim 5 further comprising:
  a) a first door passing through the outer housing and the second inner housing allowing access between the exterior of the outer housing and the interior of the second inner housing;
  b) the door having an open and closed position; and
  c) means for mounting the first door so that when in the closed position the door does not impair the shielding properties of the housing.

16. The housing of claim 15 further comprising:
  a) a second door passing through the second inner housing and the first inner housing allowing access between the interior of the second inner housing and the interior of the first inner housing;
  b) the door having an open and closed position; and
  c) means for mounting the second door so that when in the closed position the door does not impair the shielding properties of the housing.

* * * * *